United States Patent
Andreev et al.

(10) Patent No.: US 6,795,954 B2
(45) Date of Patent: Sep. 21, 2004

(54) METHOD OF DECREASING INSTANTANEOUS CURRENT WITHOUT AFFECTING TIMING

(75) Inventors: Alexander E. Andreev, San Jose, CA (US); Ranko Scepanovic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 191 days.

(21) Appl. No.: 10/278,150

(22) Filed: Oct. 21, 2002

(65) Prior Publication Data

US 2004/0076067 A1 Apr. 22, 2004

(51) Int. Cl.[7] .............................................. B06F 17/50
(52) U.S. Cl. ................................ 716/6; 716/1; 716/5
(58) Field of Search .................... 716/1, 4–6; 327/293; 707/3

(56) References Cited

U.S. PATENT DOCUMENTS

| | | | | |
|---|---|---|---|---|
| 6,323,688 B1 | * | 11/2001 | Podlesny et al. | 326/98 |
| 6,459,313 B1 | * | 10/2002 | Godbee et al. | 327/161 |
| 6,553,370 B1 | * | 4/2003 | Andreev et al. | 707/3 |
| 6,559,701 B1 | * | 5/2003 | Dillon | 327/293 |
| 6,564,211 B1 | * | 5/2003 | Andreev et al. | 707/3 |
| 6,594,797 B1 | * | 7/2003 | Dudley et al. | 714/815 |
| 6,637,014 B2 | * | 10/2003 | Casavant | 716/6 |
| 6,754,120 B1 | * | 6/2004 | Bellows et al. | 365/205 |

OTHER PUBLICATIONS

Douglas et al., "Power Supply Noise Suppression Via Clock Skew Scheduling," IEEE, Mar. 20, 2002, pp. 1–6.*
Gupta et al., "Force–Directed Scheduling for Dynamic Power Optimization," IEEE, Apr. 26, 2002, pp. 1–6.*
Bhupathi et al., "Exploiting Skewed Stated Probabilities For Low Power State Assignment," IEEE, May 1996, pp. 759–762.*
U.S. patent application Ser. No. 09/891,648, Dillon, filed Jun. 26, 2001.
U.S. patent application Ser. No. 09/679,209, Andreev et al., filed Oct. 4, 2000.
U.S. patent application Ser. No. 09/679,313, Andreev et al., filed Oct. 4, 2000.

* cited by examiner

*Primary Examiner*—Vuthe Siek
(74) *Attorney, Agent, or Firm*—Fitch, Even, Tabin & Flannery

(57) ABSTRACT

A method of calculating skews for memory cells and flip-flops in a circuit design to reduce peak power includes receiving a circuit design containing memory cells and other clocked cells; constructing a first graph that includes a union of all inputs, vertices representative of the memory cells and the other clocked cells, a union of all outputs, and edges between the vertices each having a length equal to a delay between corresponding vertices minus a clock period; constructing a second graph having vertices representative of only the memory cells and corresponding edges such that the maximum length between any two corresponding vertices is less than zero; calculating a skew for each of the memory cells from the second graph; constructing a third graph from the first graph by merging the vertices of the memory cells into a single vertex; calculating a skew for each of the other clocked cells from the third graph; normalizing each skew calculated for the other clocked cells; recalculating the skew for each of the memory cells from the normalized skew calculated for the other clocked cells; and generating as output the recalculated skew for each of the memory cells.

12 Claims, 3 Drawing Sheets

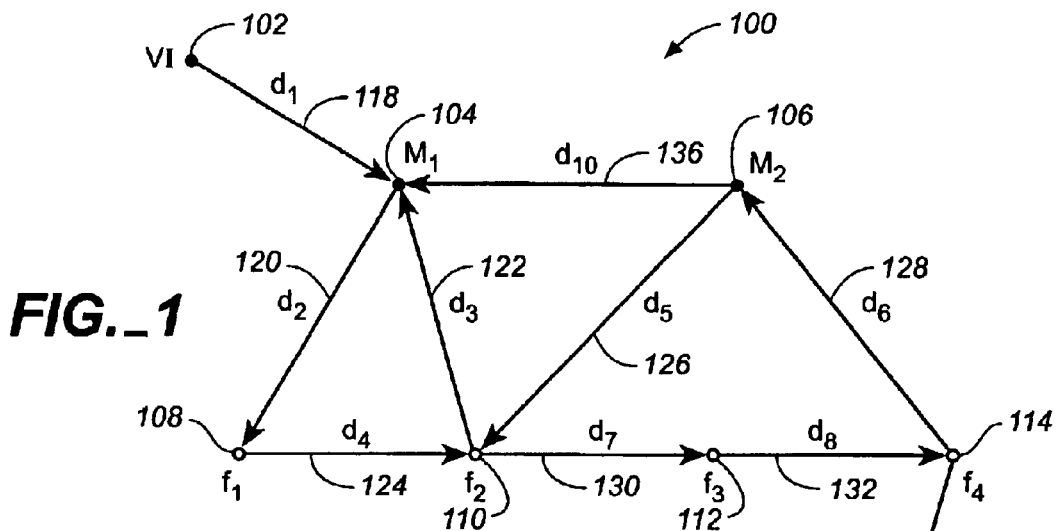
FIG._1
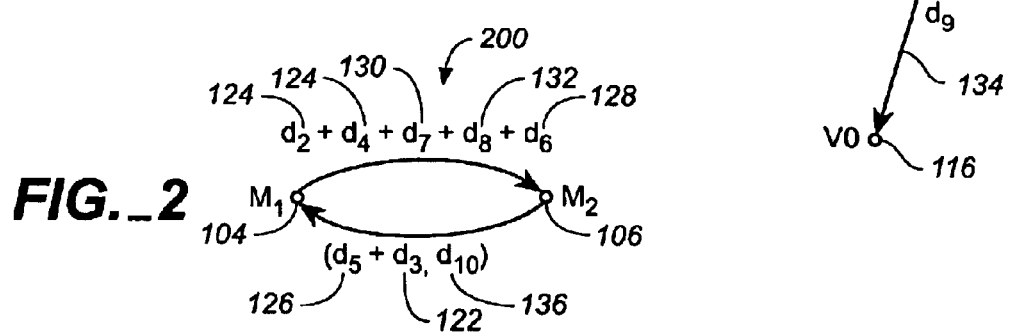
FIG._2
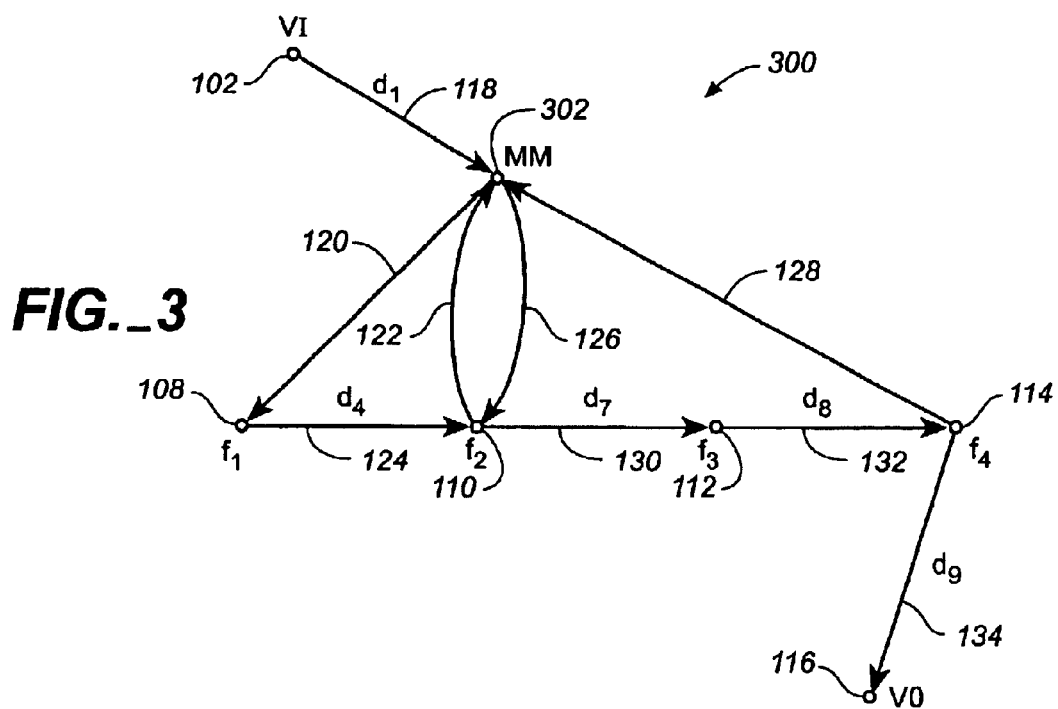
FIG._3

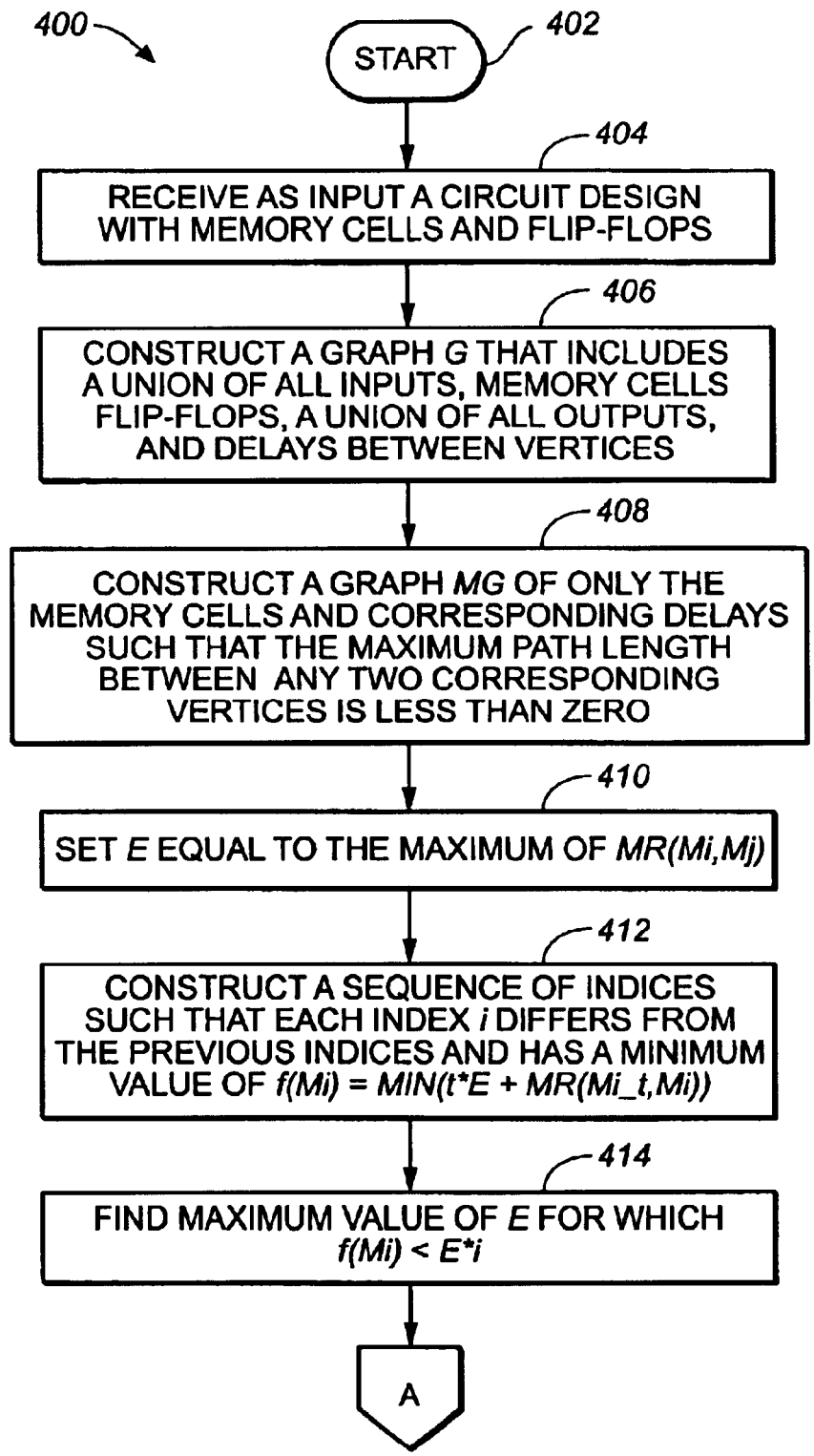
FIG._4A

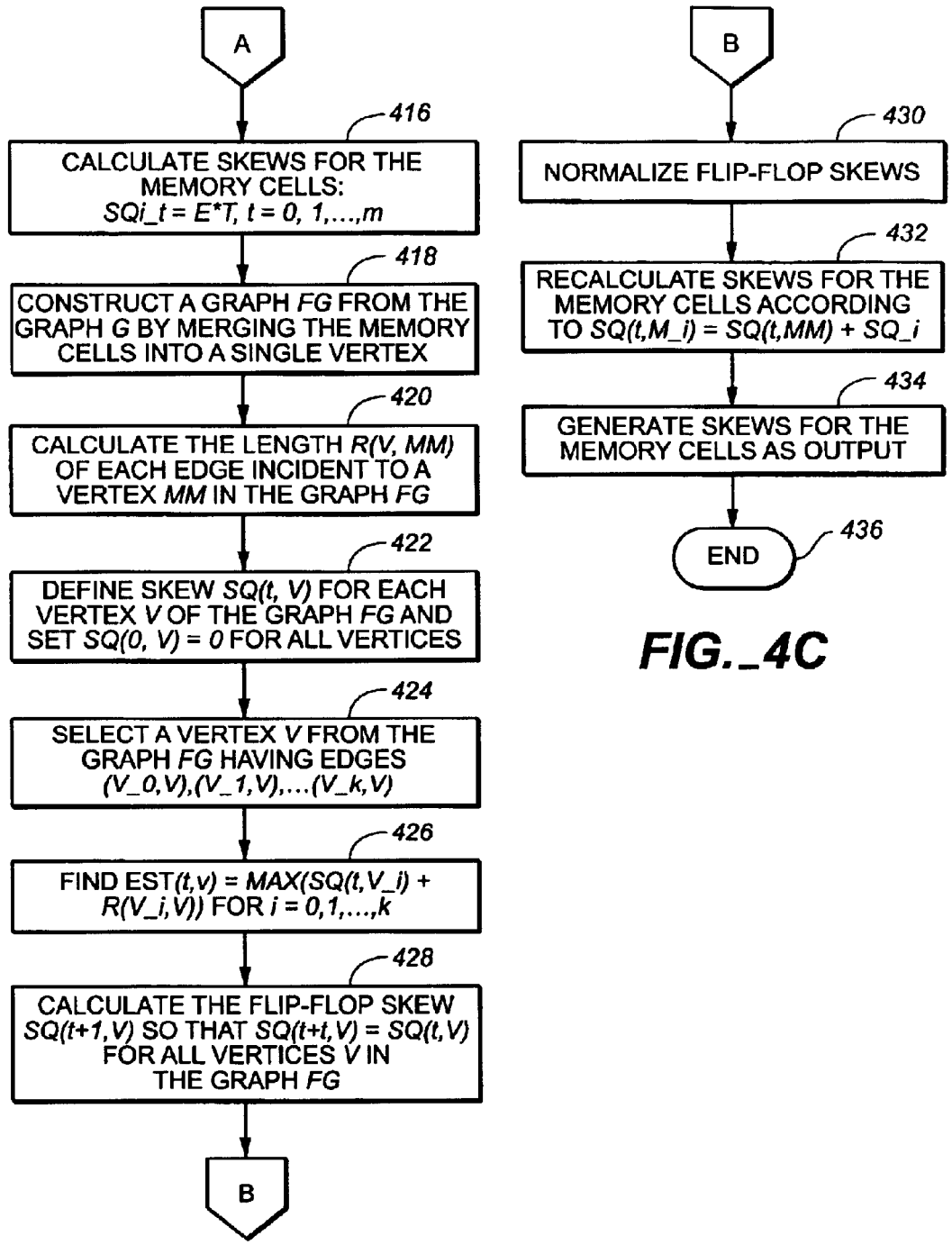
FIG._4B
FIG._4C

METHOD OF DECREASING INSTANTANEOUS CURRENT WITHOUT AFFECTING TIMING

CROSS REFERENCE TO RELATED APPLICATIONS

This application is related to U.S. patent application Ser. No. 09/891,648 for "METHOD TO REDUCE POWER BUS TRANSIENTS IN SYNCHRONOUS INTEGRATED CIRCUITS", filed on Jun. 26, 2001, by Michael N. Dillon, incorporated herein by reference and assigned to the same assignee as the present invention now U.S. Pat. No. 6,559,701; U.S. patent application Ser. No. 09/679,209 by Andreev, et. al for "FAST FLEXIBLE SEARCH ENGINE FOR LONGEST PREFIX MATCH" filed on Oct. 4, 2000, incorporated herein by reference and assigned to the same assignee as the present invention now U.S. Pat. No. 6,564,211; and U.S. patent application Ser. No. 09/679,313 by Andreev, et al. for "FLEXIBLE SEARCH ENGINE HAVING SORTED BINARY SEARCH TREE FOR PERFECT MATCH", filed on Oct. 4, 2000, incorporated herein by reference and assigned to the same assignee as the present invention now U.S. Pat. No. 6,553,370.

BACKGROUND OF THE INVENTION

The present invention is directed to methods for synthesizing balanced clock trees for an integrated circuit design. More specifically, but without limitation thereto, the present invention is directed to distributing a clock signal uniformly over a clock cycle to reduce peak current demand for an array of memory circuits without affecting timing, that is without increasing the worst path delay.

As the number of memories increases in integrated circuit designs, the problem of instantaneous peak current becomes increasingly important. Voltage drop due to the peak current demand from simultaneous switching of a large number of memory devices can result in a malfunction in the operation of the integrated circuit.

SUMMARY OF THE INVENTION

In one aspect of the present invention, a method of calculating skews for memory cells and flip-flops in a circuit design to reduce peak power includes receiving a circuit design containing memory cells and other clocked cells; constructing a first graph that includes a union of all inputs, vertices representative of the memory cells and the other clocked cells, a union of all outputs, and edges between the vertices each having a length equal to a delay between corresponding vertices minus a clock period; constructing a second graph having vertices representative of only the memory cells and corresponding edges such that the maximum length between any two corresponding vertices is less than zero; calculating a skew for each of the memory cells from the second graph; constructing a third graph from the first graph by merging the vertices of the memory cells into a single vertex; calculating a skew for each of the other clocked cells from the third graph; normalizing each skew calculated for the other clocked cells; recalculating the skew for each of the memory cells from the normalized skew calculated for the other clocked cells; and generating as output the recalculated skew for each of the memory cells.

In one embodiment, the function of calculating a first skew for each of the memory cells includes:

constructing a sequence $i_0, i_1, \ldots, i_m$ wherein $i_0$ equals zero and an index $i_{k+1}=i$ has a value such that $f(M_{i_{k+1}})$ <E*(k+1) wherein $f(M_i)=\min(t*E+MR(M_{i_j}, M_i))$, t=0, 1, ..., k, $MR(M_i, M_j)$ equals a negative of the length of the edge from vertex $V_j$ to $V_i$, E is a constant greater than zero, m is a positive integer, and k is an integer between 0 and m;

finding a length R(V,MM) of an edge (V,MM) incident to a vertex MM in the third graph;

defining a skew assigned to a vertex V of the third graph on the t-th iteration as SQ(t, V) and setting SQ(0, V) equal to zero for all vertices V of the graph FG;

selecting a vertex V from the third graph having the edges $(V_0, V), (V_1, V), \ldots, (V_k, V)$;

defining a function EST(t, V) as the maximum value of the sequence $SQ(t, V_i)+R(V_i,V)$, i=0,1, ..., k; and calculating a skew for each of the clocked non-memory cells from the function EST(t, V).

In another embodiment, the skew SQ(t+1, V) is calculated substantially from if $SQ(t,V) < EST(t,V)$, then $SQ(t+1,V) = EST(t,V)$ otherwise, $SQ(t+1,V) = SQ(t,V)$ until SQ(t+1, V) is equal to SQ(t, V) for all vertices V in the third graph.

In another embodiment, the skews $SQ_{i_t}$ for the memory cells are calculated substantially according to $SQ_{i_t}=E*t$, t=0,1, ..., m.

In another embodiment, the length R(V,MM) is the maximum value of the series $R(V, M_{i_j})-SQ_{i_j}$, t=0,1, ..., k.

In another embodiment, the skews of the clocked non-memory cells are normalized by subtracting a ports skew from each of the skews of the other clocked cells.

DESCRIPTION OF THE DRAWINGS

The present invention is illustrated by way of example and not limitation in the accompanying figures, in which like references indicate similar elements throughout the several views of the drawings, and in which:

FIG. 1 illustrates a first graph G of a circuit design according to an embodiment of the present invention;

FIG. 2 illustrates a second graph MG of only the memory cells and the associated edges of FIG. 1;

FIG. 3 illustrates a third graph FG obtained from the graph G FIG. 1 by merging the memory cells into a single vertex; and FIGS. 4A, 4B and 4C illustrate a flow chart for calculating skews for memory cells and flip-flops in a circuit design to reduce peak power according to an embodiment of the present invention density segment for the method illustrated in FIG. 1.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

In traditional methods of clock tree synthesis, a clock signal is delivered to all sequential circuit elements, for example, flip-flops and memory devices, at substantially the same time. An example of a computer program implementing such a method is Avant! Gated Clock Tree Synthesis (GCTS). For circuits having a large number of memory cells, a significant voltage drop may occur due to the simultaneous switching of the memory cells. Some methods of clock tree synthesis purposely skew the clock signal so that some of the sequential circuit elements receive the same clock signal at different times to satisfy timing constraints such as set up and hold times. An example of a computer program implementing such a method, also called a useful skew approach, is Clockwise, available from Celestry Design Technologies, Inc. In the present invention, the clock signal is skewed to arrive at different memory cells at different times to distribute the power usage uniformly over the clock period. As a result, the peak power for the memory circuits is reduced to substantially the peak power of a single memory cell plus the standby power required for the remaining memory cells. Although memory cells are used in this example, other embodiments may advantageously reduce peak power for circuit designs that include any type of clocked cells that are clocked simultaneously in large numbers.

In one aspect of the present invention, a method of calculating skews for memory cells and flip-flops in a circuit design reduces the peak power and the corresponding voltage drop.

The purpose of clock tree synthesis is to distribute a clock signal to every clocked, or sequential, circuit element on an integrated circuit die. The difference in arrival time of the clock signal between two circuit elements, or cells, on the same clock net is called clock skew. If the clock skew is zero for two memory cells, then the peak power requirement for the two memory devices is double that required for a single memory cell. The peak power requirement may be reduced by introducing a clock skew so that each memory cell receives the clock signal at a different time during the clock cycle. If timing were ignored, the problem of defining a skew distribution would be trivial. To avoid increasing the worst path delay, however, a more elaborate approach is required.

In one embodiment of a method according to the present invention, a method of calculating skews for memory cells and flip-flops in a circuit design to reduce peak power includes receiving a circuit design containing memory cells and other clocked cells; constructing a first graph that includes a union of all inputs, vertices representative of the memory cells and the other clocked cells, a union of all outputs, and edges between the vertices each having a length equal to a delay between corresponding vertices minus a clock period; constructing a second graph having vertices representative of only the memory cells and corresponding edges such that the maximum length between any two corresponding vertices is less than zero; calculating a skew for each of the memory cells from the second graph; constructing a third graph from the first graph by merging the vertices of the memory cells into a single vertex; calculating a skew for each of the other clocked cells from the third graph; normalizing each skew calculated for the other clocked cells; recalculating the skew for each of the memory cells from the normalized skew calculated for the other clocked cells; and generating as output the recalculated skew for each of the memory cells.

Using conventional placement and floorplanning tools, the delays of all cells and interconnect delays of the wires may be calculated. Without a loss of generality, a circuit design may be assumed that contains only memories and other clocked cells. The other clocked cells may be any clocked cells other than memory cells and are referred to generically herein as flip-flops.

FIG. 1 illustrates a first graph G 100 of a circuit design according to an embodiment of the present invention. Shown in FIG. 1 are vertices that include a union of all inputs VI 102, memory cells 104 and 106, flip-flops 108, 110, 112, and 114, a union of all outputs VO 116, and edges between the vertices that include delays 118, 120, 122, 124, 126, 128, 130, 132, 134, and 136.

The following definitions are introduced to facilitate illustration of an embodiment of the present invention. An edge $(V_1, V_2)$ is defined for each path in the circuit design between the standard cells. In this example, the standard cells are the flip-flops 108, 110, 112, and 114. The delay $DEL(V_1, V_2)$ represents the maximum delay from $V_1$ to $V_2$. A clock period is represented by T. The length of an edge $(V_1, V_2)$ is defined as $R(V_1, V_2)$, where:

$$R(V_1,V_2)=DEL(V_1,V_2)-T \qquad (1)$$

Because T may be larger than $R(V_1, V_2)$, the length of an edge $(V_1, V_2)$ may be negative.

An edge $(V_1, V_2)$ is defined having a length of zero and a direction from $V_1$ to $V_2$. It is assumed that the timing restrictions may be satisfied by assigning a skew to each memory cell and flip-flop. This means that the graph does not have directed circles such that the sum of edges is a positive length. A directed circle is a set of points connected in a the same direction, that is, the head of each edge points to the tail of the next. For example, the edges A to B, B to C, and C to A constitute a directed circle, as do the edges A to C, C to B, and B to A. The edges A to B, B to C, and A to C do not constitute a directed circle, because the edge between vertices A,C is connected in the opposite direction with respect to the edges between vertices A,B and B,C.

$FR(V_1, V_2)$ is defined as the maximum length of the directed path, or sum of the edges, from $V_1$ to $V_2$. This length may be found, for example, by an expansion algorithm according to techniques that are well known in the art.

FIG. 2 illustrates a second graph MG 200 of only the memory cells 104 and 106 and the associated delays 120, 122, 124, 126, 128, 130, 132, and 136 of FIG. 1. The directed edge $(M_i, M_j)$ exists if the graph 100 has a directed path from $(M_i, M_j)$. The length of this edge is $FR(M_i, M_j)$. For example, the edge $(M_1, M_2)$ has the directed path that is the sum of the delays 120, 124, 130, 132, and 128, therefore the edge $(M_1, M_2)$ is a directed edge. It is assumed that $FR(M_i, M_j)<0$ for all edges, that is, that there is some available delay for changing the skew without violating the timing restrictions.

$SQ_i$ is defined as the skew of the i-th memory cell $M_i$. If the graph 200 contains the edge $(M_i, M_j)$, then the skews must satisfy the equation:

$$SQ_j=SQ_i+FR(M_i,M_j) \qquad (2)$$

A length $MR(M_i, M_j)$ is defined such that:

$$MR(M_i,M_j)=-FR(M_j,M_i) \qquad (3)$$

All values for $MR(M_i, M_j)$ are positive, and the skew restrictions may be expressed as:

$$SQ_j=SQ_i+MR(M_i,M_j) \qquad (4)$$

if the graph 200 contains the edge $(M_j, M_i)$.

To find the skews for the memory cells, a constant E>0 is defined as, for example, the maximum value of $MR(M_i, M_j)$. A sequence $i_0, i_1, \ldots, i_m$ is constructed by setting the first term $i_0$ equal to zero and generating a term $i_{k+1}=i$ from the previous terms in the sequence $i_0, i_1, \ldots, i_k$ from the formula:

$$SQ_{i_t}=E*t, \quad t=0, 1, \ldots, k \tag{5}$$

$f(M_i)$ is defined as the minimum of the numbers generated by the formula:

$$f(M_i)=\min(t*E+MR(M_{i_t}, M_i), t=0, 1, \ldots, k) \tag{6}$$

The index $i_{k+1}=i$ is selected that is different from the indices in the sub-sequence $i_0, i_1, \ldots, i_k$ such that $f(M_i)$ has a minimum possible value. The maximum value of E is found for which the relation $$f(M_{i_{k+1}}) < E*(k+1) \tag{7}$$

is true, for example, by dividing in half each iteration until a false value is returned. For example, for a function $f(x)$ having values 1 and 0 and $x>y \rightarrow f(x)<=f(y)$; that is, there exists A such that $f(x)=1$ if $x<A$ and $f(x)=0$ if $x>A$. Letting $u=1.0$ and $u=2*u$ while $f(u)==1$, a value of u is found for which $f(u)=0$. In a similar manner, $v=1.0$ and $v=v/2$ while $f(v)==0$, a value of v is found for which $f(v)=1$. This means that $v<=A<=u$. The precision eps is set, for example, to eps=0.00001, While (u-v)>eps:

w=(u+v)/2;

if (f(w)==1) {v=w; u=u;} else {v=v; u=w}

When (u-v)<=eps, both u and v are approximations of A. In this case, $F(x)=1$ if $f(M_{i_{k+1}})<x*(k+1)$, else $F(x)=0$. Starting from u=1.0, while F(u)=1, u=2*u until a value of u is found for which F(u)=0. Starting from v=1.0, while F(v)=1, v=v/2 until a value of v is found for which F(v)=1. This means that v<=A<=u. While (u-v)>eps:

w=(u+v)/2;

if (F(w)==1){v=w; u=u;} else {v=v; u=w;}

When (u-v)<=eps, both u and v are approximations of A.

In this manner the sequence $i_0, i_1, \ldots i_m$ is constructed so that $$SQ_{i_t}=E*t, \quad t=0, 1, \ldots, m \tag{8}$$

FIG. 3 illustrates a third graph FG 300 obtained from the graph G FIG. 1 by merging the memory cells into a single vertex. Shown in FIG. 3 are vertices that include the single memory vertex MM 302, a union of all inputs 102, flip-flops 108, 110, 112, and 114, a union of all outputs 116, and edges that include delays 118, 120, 122, 124, 126, 128, 130, 132, and 134.

The computation of the length of the edges incident to the vertex MM 302 is performed as follows.

Edges for a vertex V in the first graph G 100 are defined by:

$$(M_{i_0},V), \ldots, (M_{i_k},V) \tag{9}$$

The length R(MM, V) of the edge (MM, V) is the maximum value in the series:

$$R(M_{i_t},V)+SQ_{i_t}, \quad t=0, 1, \ldots, k \tag{10}$$

A vertex V in the third graph FG 300 is selected having edges $(V_0, V), (V_1, V), \ldots, (V_k, V)$. The length R (V,MM) of the edge (V,MM) is defined as the maximum value of the series:

$$R(V, M_{i_t})-SQ_{i_t}, \quad t=0, 1, \ldots, k \tag{11}$$

The skews for the flip-flops 108, 110, 112, and 114 are calculated iteratively as follows. The skew assigned to the vertex V of the third graph FG 300 on the t-th iteration is defined as SQ(t,V). SQ(0,V) is set equal to zero for all vertices V of the graph 300.

A vertex V is selected from the graph 300 having the edges $(V_0, V), (V_1, V), \ldots, (V_k, V)$, A function EST(t,V) is defined as the maximum value of the sequence:

$$SQ(t, V_i)+R(V_i,V), \quad i=0, 1, \ldots, k \tag{12}$$

and SQ(t+1,V) is calculated iteratively from the formula:

if $SQ(t,V)<EST(t,V)$, then $SQ(t+1,V)=EST(t,V)$ otherwise, $SQ(t+1,V)=SQ(t,V)$ (13)

The procedure is complete when SQ(t+1, V) is equal to SQ(t, V) for all vertices V in the third graph FG 300. The skews for the memory cells are recalculated from formulas (8) and (13) according to the formula:

$$SQ(t, M_i)=SQ(t, MM)+SQ_i \tag{14}$$

FIGS. 4A, 4B and 4C illustrate a flow chart 400 for calculating skews for memory cells and flip-flops in a circuit design to reduce peak power according to an embodiment of the present invention.

Step 402 is the entry point of the flow chart 400.

In step 404, a circuit design containing memory cells and other clocked cells, such as flip-flops, is received as input.

In step 406, a first graph G is constructed that includes a union of all inputs VI, memory cells, flip-flops, a union of all outputs VO, and edges each having a path length $FR(V_i, V_j)$ equal to the delay between the corresponding vertices minus the clock period T.

In step 408, a second graph MG of only the memory cells is constructed having vertices $M_1, \ldots, M_m$ such that the maximum path length $FR(V_i, V_j)$ between any two corresponding vertices $V_i$ and $V_j$ is less than zero.

In step 410, a constant E>0 is defined as, for example, the maximum value of $MR(M_i, M_j)=-FR(V_j, V_i)$.

In step 412, a sequence $i_0, i_1, \ldots, i_m$ is constructed by setting the first index $i_0$ equal to zero and generating an index $i_{k+1}$ that is different from the previous indices in the sequence $i_0, i_1, \ldots, i_k$ having a minimum value of $f(M_i)$ defined as the minimum of the values generated by formula (6).

In step 414, the maximum value of E is found for which the relation (7) is true.

In step 416, the skews $SQ_{i_t}$ for the memory cells are calculated from formula (8).

In step 418, a third graph FG is constructed from the first graph G by merging the memory cells into a single vertex.

In step 420, the computation of the length R(V,MM) of the each edge (V,MM) incident to a vertex MM in the graph FG is calculated from formula (11).

In step 422, the skew assigned to the vertex V of the third graph FG on the t-th iteration is defined as SQ(t, V), and SQ(0,V) is set equal to zero for all vertices V of the graph FG.

In step 424, a vertex V is selected from the graph FG having the edges $(V_0, V), (V_1, V), \ldots, (V_k, V)$, In step 426, a function EST(t, V) is defined as the maximum value of the sequence given by formula (12).

In step 428, the flip-flop skew SQ(t+1, V) is calculated from formula (13) until SQ(t+1, V) is equal to SQ(t, V) for all vertices V in the third graph FG.

In step 430, the flip-flop skews are normalized by subtracting the ports skew from each of the skews SQ(t, V).

In step 432, the skews for the memory cells are calculated from the skews calculated in formulas (8) and (13) according to formula (14).

In step 434, the skews for the memory cells calculated in step 432 are generated as output.

Step 436 is the exit point of the flow chart 400.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The methods illustrated in the flowchart descriptions above may be embodied in a computer program product for calculating skews for memory cells and flip-flops in a circuit design to reduce peak power according to various embodiments of the present invention and implemented by a computer according to well known programming techniques to perform the following functions:

receiving a circuit design containing memory cells and other clocked cells;

constructing a first graph that includes a union of all inputs, vertices representative of the memory cells and the other clocked cells, a union of all outputs, and edges between the vertices each having a length equal to a delay between corresponding vertices minus a clock period;

constructing a second graph having vertices representative of only the memory cells and corresponding edges such that the maximum length between any two corresponding vertices is less than zero;

calculating a skew for each of the memory cells from the second graph;

constructing a third graph from the first graph by merging the vertices of the memory cells into a single vertex;

calculating a skew for each of the other clocked cells from the third graph;

normalizing each skew calculated for the other clocked cells;

recalculating the skew for each of the memory cells from the normalized skew calculated for the other clocked cells; and generating as output the recalculated skew for each of the memory cells.

In one embodiment, the function of calculating a first skew for each of the memory cells includes:

constructing a sequence $i_0, i_1, \ldots, i_m$ wherein $i_0$ equals zero and an index $i_{k+1}=i$ has a value such that $f(M_{i_{k+1}}) < E*(k+1)$ wherein $f(M_i)=\min(t*E+MR(M_i, M_j), t=0, 1, \ldots, k)$, $MR(M_i, M_j)$ equals a negative of the length of the edge from vertex $V_j$ to $V_i$, E is a constant greater than zero, m is a positive integer, and k is an integer between 0 and m;

finding a length R(V,MM) of an edge (V,MM) incident to a vertex MM in the third graph;

defining a skew assigned to a vertex V of the third graph on the t-th iteration as SQ(t, V) and setting SQ(0, V) equal to zero for all vertices V of the graph FG;

selecting a vertex V from the third graph having the edges $(V_0, V), (V_1, V), \ldots, (V_k, V)$;

defining a function EST(t, V) as the maximum value of the sequence $SQ(t, V_i)+R(V_i,V)$, $i=0, 1, \ldots, k$; and calculating a skew for each of the clocked non-memory cells from the function EST(t, V).

In another embodiment, the skew SQ(t+1, V) is calculated substantially from if $SQ(t,V) < EST(t,V)$, then $SQ(t+1,V) = EST(t,V)$ otherwise, $SQ(t+1,V) = SQ(t,V)$ until SQ(t+1, V) is equal to SQ(t, V) for all vertices V in the third graph.

In another embodiment, the skews $SQ_{i_t}$ for the memory cells are calculated substantially according to $SQ_{i_t}=E*t$, $t=0, 1, \ldots, m$.

In another embodiment, the length R(V,MM) is the maximum value of the series $R(V, M_{i_t})-SQ_{i_t}$, $t=0, 1, \ldots, k$.

In another embodiment, the skews of the clocked non-memory cells are normalized by subtracting a ports skew from each of the skews of the other clocked cells.

While the invention herein disclosed has been described by means of specific embodiments and applications thereof, numerous modifications and variations could be made thereto by those skilled in the art without departing from the scope of the invention set forth in the following claims.

What is claimed is:

1. A method of calculating skews for memory cells and flip-flops in a circuit design to reduce peak power comprising:

receiving a circuit design containing memory cells and other clocked cells;

constructing a first graph that includes a union of all inputs, vertices representative of the memory cells and the other clocked cells, a union of all outputs, and edges between the vertices each having a length equal to a delay between corresponding vertices minus a clock period;

constructing a second graph having vertices representative of only the memory cells and corresponding edges such that the maximum length between any two corresponding vertices is less than zero;

calculating a skew for each of the memory cells from the second graph;

constructing a third graph from the first graph by merging the vertices of the memory cells into a single vertex;

calculating a skew for each of the other clocked cells from the third graph;

normalizing each skew calculated for the other clocked cells;

recalculating the skew for each of the memory cells from the normalized skew calculated for the other clocked cells; and generating as output the recalculated skew for each of the memory cells.

2. The method of claim 1 wherein calculating a first skew for each of the memory cells comprises:

constructing a sequence $i_0, i_1, \ldots, i_m$ wherein $i_0$ equals zero and an index $i_{k+1}=i$ has a value such that $f(M_{i_{k+1}}) < E*(k+1)$ wherein $f(M_i)=\min(t*E+MR(M_i, M_j), t=0, 1, \ldots, k)$, $MR(M_i, M_j))$ equals a negative of the length of the edge from vertex $V_j$ to $V_i$, E is a constant greater than zero, m is a positive integer, and k is an integer between 0 and m;

finding a length R(V,MM) of an edge (V,MM) incident to a vertex MM in the third graph;

defining a skew assigned to a vertex V of the third graph on the t-th iteration as SQ(t,V) and setting SQ(0,V) equal to zero for all vertices V of the third graph;

selecting a vertex V from the third graph having the edges $(V_0, V), (V_1, V), \ldots, (V_k, V)$;

defining a function EST(t, V) as the maximum value of the sequence $SQ(t, V_i)+R(V_i,V)$, i=0, 1, ..., k; and calculating a skew for each of the clocked non-memory cells from the function EST(t, V).

3. The method of claim 2 wherein the skew SQ(t+1, V) is calculated substantially from iff $SQ(t,V)<EST(t,V)$, then $SQ(t+1,V)=EST(t,V)$ otherwise, $SQ(t+1,V)=SQ(t,V)$ until SQ(t+1, V) is equal to SQ(t, V) for all vertices V in the third graph.

4. The method of claim 2 wherein the skews $SQ_{i_t}$ for the memory cells are calculated substantially according to $SQ_{i_t}=E*t$, t=0, 1, ..., m.

5. The method of claim 4 wherein the length R(V, MM) is the maximum value of the series $R(V, M_{i_t})-SQ_{i_t}$, t=0, 1, ..., k.

6. The method of claim 1 wherein the skews of the clocked non-memory cells are normalized by subtracting a ports skew from each of the skews of the other clocked cells.

7. A computer program product for calculating skews for memory cells and flip-flops in a circuit design to reduce peak power comprising:

a medium for embodying a computer program for input to a computer; and a computer program embodied in the medium for causing the computer to perform the following functions:

receiving a circuit design containing memory cells and other clocked cells;

constructing a first graph that includes a union of all inputs, vertices representative of the memory cells and the other clocked cells, a union of all outputs, and edges between the vertices each having a length equal to a delay between corresponding vertices minus a clock period;

constructing a second graph having vertices representative of only the memory cells and corresponding edges such that the maximum length between any two corresponding vertices is less than zero;

calculating a skew for each of the memory cells from the second graph;

constructing a third graph from the first graph by merging the vertices of the memory cells into a single vertex;

calculating a skew for each of the other clocked cells from the third graph;

normalizing each skew calculated for the other clocked cells;

recalculating the skew for each of the memory cells from the normalized skew calculated for the other clocked cells; and generating as output the recalculated skew for each of the memory cells.

8. The computer product of claim 7 wherein calculating a first skew for each of the memory cells comprises:

constructing a sequence $i_0, i_1, \ldots i_m$ wherein $i_0$ equals zero and an index $i_{k+1}=i$ has a value such that $f(M_{i_{k+1}})<E*(k+1)$ wherein $f(M_i)=\min(t*E+MR(M_i, M_i))$, t=0, 1, ..., k), $MR(M_i, M_j)$ equals a negative of the length of the edge from vertex $V_j$ to $V_i$, E is a constant greater than zero, m is a positive integer, and k is an integer between 0 and m;

finding a length R(V,MM) of an edge (V,MM) incident to a vertex MM in the third graph;

defining a skew assigned to a vertex V of the third graph on the t-th iteration as SQ(t, V) and setting SQ(0, V) equal to zero for all vertices V of the third graph;

selecting a vertex V from the third graph having the edges $(V_0, V), (V_1, V), \ldots, (V_k, V)$;

defining a function EST(t, V) as the maximum value of the sequence $SQ(t, V_i)+R(V_i,V)$, i=0, 1, ..., k; and calculating a skew for each of the clocked non-memory cells from the function EST(t, V).

9. The computer product of claim 8 wherein the skew SQ(t+1, V) is calculated substantially from if $SQ(t,V)<EST(t,V)$, then $SQ(t+1,V)=EST(t,V)$ otherwise, $SQ(t+1,V)=SQ(t,V)$ until SQ(t+1, V) is equal to SQ(t, V) for all vertices V in the third graph.

10. The computer product of claim 8 wherein the skews $SQ_{i_t}$ for the memory cells are calculated substantially according to $SQ_{i_t}=E*t$, t=0, 1, ..., m.

11. The computer product of claim 10 wherein the length R(V,MM) is the maximum value of the series $R(V, M_{i_t})-SQ_{i_t}$, t=0, 1, ..., k.

12. The computer product of claim 7 wherein the skews of the clocked non-memory cells are normalized by subtracting a ports skew from each of the skews of the other clocked cells.

* * * * *